US010053770B2

United States Patent
Miyanaga et al.

(10) Patent No.: US 10,053,770 B2
(45) Date of Patent: *Aug. 21, 2018

(54) OXIDE SINTERED BODY AND SEMICONDUCTOR DEVICE

(71) Applicant: Sumitomo Electric Industries, Ltd., Osaka-shi (JP)

(72) Inventors: Miki Miyanaga, Itami (JP); Kenichi Watatani, Itami (JP); Koichi Sogabe, Itami (JP); Hideaki Awata, Itami (JP); Kenichi Kurisu, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/100,174

(22) PCT Filed: Apr. 8, 2015

(86) PCT No.: PCT/JP2015/060969
§ 371 (c)(1),
(2) Date: May 27, 2016

(87) PCT Pub. No.: WO2016/063557
PCT Pub. Date: Apr. 28, 2016

(65) Prior Publication Data
US 2017/0029933 A1  Feb. 2, 2017

(30) Foreign Application Priority Data

Oct. 22, 2014 (JP) .................................. 2014-215468

(51) Int. Cl.
*H01B 1/08* (2006.01)
*C23C 14/00* (2006.01)
(Continued)

(52) U.S. Cl.
CPC .......... *C23C 14/3414* (2013.01); *C04B 35/00* (2013.01); *C04B 35/495* (2013.01);
(Continued)

(58) Field of Classification Search
CPC .. H01B 1/00; H01B 1/08; C04B 35/00; C23C 14/34; H01L 21/363; H01L 29/786
See application file for complete search history.

(56) References Cited

U.S. PATENT DOCUMENTS 9,543,444 B2 *  1/2017  Kishimoto ..........  H01L 29/7869
2004/0040414 A1  3/2004  Abe
(Continued)

FOREIGN PATENT DOCUMENTS

CN  1690011 A  11/2005
CN  102460712 A  5/2012
(Continued)

OTHER PUBLICATIONS

Luo et al "Upconversion luminescence properties of Li doped ZnWO4:Yb,Er", J. Mater. Res. vol. 23, No. 8, Aug. 2008 (pp. 2078-2083).*
(Continued)

*Primary Examiner* — Mark Kopec
(74) *Attorney, Agent, or Firm* — Venable LLP; Michael A. Sartori; Kerri M. Patterson

(57) ABSTRACT

There is provided an oxide sintered body including indium, tungsten, and at least one of zinc and tin, wherein the oxide sintered body includes, as a crystal phase, a complex oxide crystal phase including tungsten and at least one of zinc and tin. There is also provided a semiconductor device including an oxide semiconductor film formed by a sputtering method by using the oxide sintered body as a target.

7 Claims, 2 Drawing Sheets

(51) Int. Cl.

| | | |
|---|---|---|
| *C23C 14/34* | (2006.01) | |
| *C04B 35/00* | (2006.01) | |
| *H01L 29/786* | (2006.01) | |
| *C04B 35/495* | (2006.01) | |
| *C04B 35/622* | (2006.01) | |
| *C23C 14/08* | (2006.01) | |
| *H01J 37/34* | (2006.01) | |
| *H01L 21/02* | (2006.01) | |
| *H01L 29/66* | (2006.01) | |

(52) U.S. Cl.
CPC ...... *C04B 35/62218* (2013.01); *C23C 14/083* (2013.01); *C23C 14/086* (2013.01); *C23C 14/34* (2013.01); *H01B 1/08* (2013.01); *H01J 37/3429* (2013.01); *H01L 21/02565* (2013.01); *H01L 21/02631* (2013.01); *H01L 29/66969* (2013.01); *H01L 29/786* (2013.01); *H01L 29/7869* (2013.01); *C04B 2235/326* (2013.01); *C04B 2235/3284* (2013.01); *C04B 2235/3286* (2013.01); *C04B 2235/3293* (2013.01)

(56) References Cited

U.S. PATENT DOCUMENTS

| | | | |
|---|---|---|---|
| 2005/0239660 | A1 | 10/2005 | Abe et al. |
| 2006/0099140 | A1 | 5/2006 | Abe |
| 2007/0126344 | A1 | 6/2007 | Ohashi et al. |
| 2007/0170434 | A1* | 7/2007 | Inoue .................. C04B 35/01 257/72 |
| 2008/0191204 | A1 | 8/2008 | Kim et al. |
| 2010/0025680 | A1 | 2/2010 | Shino et al. |
| 2010/0276688 | A1 | 11/2010 | Yano et al. |
| 2011/0042669 | A1 | 2/2011 | Kim et al. |
| 2011/0168994 | A1 | 7/2011 | Kawashima et al. |
| 2011/0240935 | A1 | 10/2011 | Yano et al. |
| 2012/0037897 | A1 | 2/2012 | Shiino et al. |
| 2015/0279943 | A1 | 10/2015 | Nakayama |
| 2016/0251264 | A1 | 9/2016 | Miyanaga et al. |
| 2017/0012133 | A1 | 1/2017 | Miyanaga et al. |
| 2017/0029933 | A1 | 2/2017 | Miyanaga et al. |
| 2017/0062620 | A1 | 3/2017 | Yamazaki et al. |
| 2017/0069474 | A1* | 3/2017 | Miyanaga .............. C04B 35/00 |

FOREIGN PATENT DOCUMENTS

| | | |
|---|---|---|
| EP | 1734150 A1 | 12/2006 |
| EP | 2421048 A1 | 2/2012 |
| EP | 2980041 A1 | 2/2016 |
| JP | 2002-275623 A | 9/2002 |
| JP | 2004-091265 A | 3/2004 |
| JP | 2005-314131 A | 11/2005 |
| JP | 2006-022373 A | 1/2006 |
| JP | 2006-160535 A | 6/2006 |
| JP | 2006-188392 A | 7/2006 |
| JP | 2006-193363 A | 7/2006 |
| JP | 2006-347807 A | 12/2006 |
| JP | 2007-153702 A | 6/2007 |
| JP | 2008-192721 A | 8/2008 |
| JP | 2008-199005 A | 8/2008 |
| JP | 2010-251604 A | 11/2010 |
| JP | 2013-001590 A | 1/2013 |
| JP | 2013-173658 A | 9/2013 |
| JP | 2013-184840 A | 9/2013 |
| KR | 10-2006-0046691 A | 5/2006 |
| WO | 2014/058019 A1 | 4/2014 |
| WO | 2015/146745 A1 | 10/2015 |

OTHER PUBLICATIONS

Notice of Grounds of Rejection in counterpart Japanese Patent Applicaition No. 2014-215468, dated Dec. 20, 2016.
Extended European Search Report in counterpart European Patent Application No. 15851758.1, dated Nov. 14, 2016.
International Search Report in PCT International Application No. PCT/JP2015/060969, dated Jun. 30, 2015.
International Search Report in International Application No. PCT/JP2015/058061, dated Jun. 16, 2015.
Notification of First Office Action in Chinese Patent Application No. 201580000813.3, dated Jun. 2, 2016.
International Search Report in International Application No. PCT/JP2015/079160, dated Dec. 8, 2015.
U.S. Appl. No. 15/122,448, filed Aug. 30, 2016.
Grounds for Rejection in counterpart Korean Patent Application No. 10-2015-7032831, dated Sep. 22, 2016.
Extended European Search Report in counterpart European Patent Application No. 15768922.5, dated Dec. 13, 2016.
U.S. Appl. No. 14/787,751, filed Oct. 28, 2015.
Office Action issued in U.S. Appl. No. 14/787,751, dated Jul. 27, 2017.
Restriction Requirement issued in U.S. Appl. No. 14/787,751, dated May 15, 2017.
Notice of Allowance issued in U.S. Appl. No. 14/787,751, dated Nov. 1, 2017.
Notice of Allowance issued in U.S. Appl. No. 14/787,751, dated Dec. 28, 2017 [Related Application;].
U.S. Appl. No. 15/928,769, filed Mar. 22, 2018.
Restriction Requirement issued in U.S. Appl. No. 15/122,448, dated May 22, 2018.

* cited by examiner (A)

(B)

(C)

(D)

OXIDE SINTERED BODY AND SEMICONDUCTOR DEVICE

TECHNICAL FIELD

The present invention relates to an oxide sintered body suitably used as a target for forming an oxide semiconductor film by a sputtering method, and a semiconductor device including the oxide semiconductor film formed by using the oxide sintered body.

BACKGROUND ART

In a liquid crystal display device, a thin-film EL (electroluminescence) display device, an organic EL display device or the like, an amorphous silicon film has been conventionally mainly used as a semiconductor film that functions as a channel layer of a TFT (thin-film transistor) which is a semiconductor device.

In recent years, however, attention has been focused on an oxide semiconductor film mainly composed of an In—Ga—Zn-based composite oxide (hereinafter also referred to as "IGZO") as the aforementioned semiconductor film, because of the advantage of higher carrier mobility as compared with the amorphous silicon film.

For example, Japanese Patent Laying-Open No. 2008-199005 (PTD 1) discloses that this oxide semiconductor film mainly composed of IGZO is formed by a sputtering method using a target.

In addition, Japanese Patent Laying-Open No. 2004-091265 (PTD 2) discloses an oxide sintered body mainly made of indium and including tungsten, as a material suitably used when forming an oxide semiconductor film by the sputtering method and the like.

CITATION LIST

Patent Document

PTD 1: Japanese Patent Laying-Open No. 2008-199005
PTD 2: Japanese Patent Laying-Open No. 2004-091265

SUMMARY OF INVENTION

Technical Problem

In the TFT (thin-film transistor) which is the semiconductor device including, as the channel layer, the oxide semiconductor film mainly composed of IGZO as disclosed in Japanese Patent Laying-Open No. 2008-199005 (PTD 1), gallium oxide made of metal gallium which is high in market price is used as a raw material, and thus, the TFT had a problem of high manufacturing cost.

The TFT which is a semiconductor device including, as a channel layer, the oxide semiconductor film fabricated by using the oxide sintered body mainly made of indium and including tungsten as disclosed in Japanese Patent Laying-Open No. 2004-091265 (PTD 2) had a problem that an OFF current is high, i.e., approximately $1 \times 10^{-11}$ A, and thus, a ratio of an ON current to the OFF current cannot be sufficiently increased unless a driving voltage is raised to approximately 70 V.

An object of the present invention is to solve the aforementioned problems and provide an oxide sintered body suitable for forming an oxide semiconductor film of a semiconductor device having high characteristics, and a semiconductor device including the oxide semiconductor film formed by using the oxide sintered body.

Solution to Problem

According to an aspect, the present invention is directed to an oxide sintered body including indium, tungsten, and at least one of zinc and tin, wherein the oxide sintered body includes, as a crystal phase, a complex oxide crystal phase including tungsten and at least one of zinc and tin.

According to another aspect, the present invention is directed to a semiconductor device including an oxide semiconductor film formed by a sputtering method by using the oxide sintered body according to the aforementioned aspect as a target.

Advantageous Effects of Invention

According to the foregoing, there can be provided an oxide sintered body suitable for forming an oxide semiconductor film of a semiconductor device having high characteristics, and a semiconductor device including the oxide semiconductor film formed by using the oxide sintered body.

BRIEF DESCRIPTION OF DRAWINGS

FIG. 1 is a schematic view showing one example of a semiconductor device according to the present invention, in which FIG. 1(A) shows a schematic plan view and FIG. 1(B) shows a schematic cross-sectional view taken along line IB-IB shown in FIG. 1(A).

DESCRIPTION OF EMBODIMENTS

Figure 1:
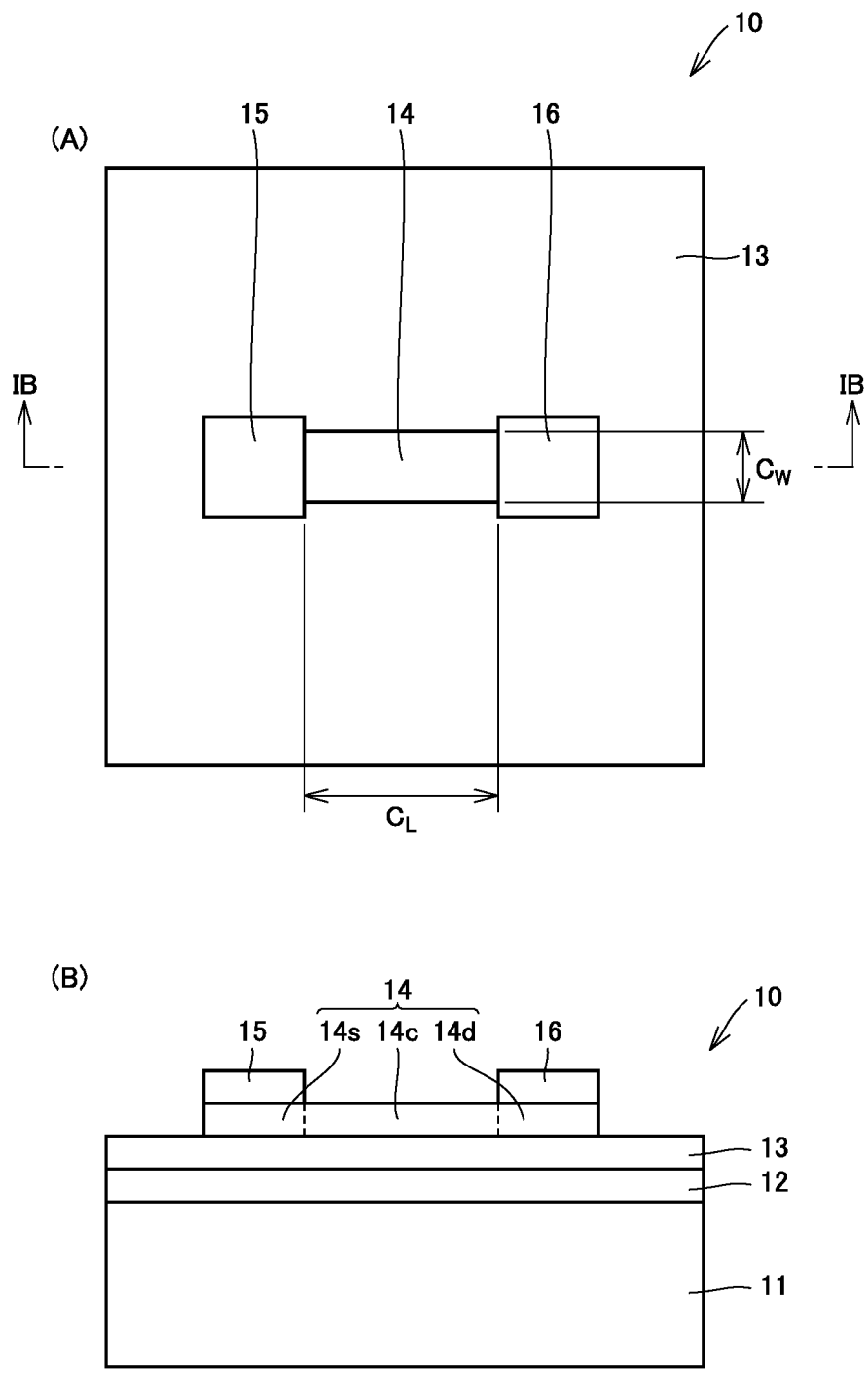

Description of Embodiments of the Present Invention

An oxide sintered body which is an embodiment of the present invention is an oxide sintered body including indium, tungsten, and at least one of zinc and tin, wherein the oxide sintered body includes, as a crystal phase, a complex oxide crystal phase including tungsten and at least one of zinc and tin. The oxide sintered body of the present embodiment includes, as a crystal phase, the complex oxide crystal phase including tungsten and at least one of zinc and tin, and thus, in a TFT (thin-film transistor) which is a semiconductor device including, as a channel layer, an oxide semiconductor film formed by using the oxide sintered body, the OFF current can be decreased and the ratio of the ON current to the OFF current can be increased at low driving voltage. In addition, the thermal conductivity of the oxide sintered body can be increased.

The oxide sintered body of the present embodiment may further include a bixbite type phase as a crystal phase. As a result, in a TFT which is a semiconductor device including, as a channel layer, an oxide semiconductor film formed by using the oxide sintered body, the OFF current can be decreased and the ratio of the ON current to the OFF current can be increased at low driving voltage. In addition, the thermal conductivity of the oxide sintered body can be increased.

When the oxide sintered body of the present embodiment includes, as the crystal phases, the complex oxide crystal phase including tungsten and at least one of zinc and tin and the bixbite type phase, a double phase occupancy rate, which is an occupancy rate of a total area of the complex oxide crystal phase and the bixbite type phase to an area of a cross section of the oxide sintered body in the cross section, may be equal to or higher than 95% and equal to or lower than 100%. As a result, in a TFT which is a semiconductor device including, as a channel layer, an oxide semiconductor film formed by using the oxide sintered body, the OFF current can be decreased and the ratio of the ON current to the OFF current can be increased at low driving voltage, and variations of the characteristics in the main surface can be reduced. In addition, the thermal conductivity of the oxide sintered body can be increased.

In the oxide sintered body of the present embodiment, a complex oxide crystal phase occupancy rate, which is an occupancy rate of an area of the complex oxide crystal phase including tungsten and at least one of zinc and tin to an area of a cross section of the oxide sintered body in the cross section, may be higher than 0% and equal to or lower than 50%. As a result, in a TFT which is a semiconductor device including, as a channel layer, an oxide semiconductor film formed by using the oxide sintered body, the OFF current can be decreased and the ratio of the ON current to the OFF current can be increased at low driving voltage, and variations of the characteristics in the main surface can be reduced. In addition, the thermal conductivity of the oxide sintered body can be increased.

In the oxide sintered body of the present embodiment, the complex oxide crystal phase may include at least one type of crystal phase selected from the group consisting of a $ZnWO_4$ type phase, a $Zn_2W_3O_8$ type phase, a $WSnO_4$ type phase, a $WSn_2O_5$ type phase, and a $WSn_3O_6$ type phase. As a result, in a TFT which is a semiconductor device including, as a channel layer, an oxide semiconductor film formed by using the oxide sintered body, the OFF current can be decreased and the ratio of the ON current to the OFF current can be increased at low driving voltage. In addition, the thermal conductivity of the oxide sintered body can be increased.

In the oxide sintered body of the present embodiment, a content rate of tungsten to all metal elements and silicon included in the oxide sintered body may be equal to or higher than 0.5 atomic % and equal to or lower than 20 atomic %. As a result, in a TFT which is a semiconductor device including, as a channel layer, an oxide semiconductor film formed by using the oxide sintered body, the ratio of the ON current to the OFF current can be increased at low driving voltage. In addition, the film formation speed of the oxide semiconductor film can be increased.

In the oxide sintered body of the present embodiment, a content rate of at least one type of element selected from the group consisting of aluminum, titanium, chromium, gallium, hafnium, zirconium, silicon, molybdenum, vanadium, niobium, tantalum, and bismuth to all metal elements and silicon included in the oxide sintered body may be equal to or higher than 0.1 atomic % and equal to or lower than 10 atomic %. As a result, in a TFT which is a semiconductor device including, as a channel layer, an oxide semiconductor film formed by using the oxide sintered body, the OFF current can be decreased and the ratio of the ON current to the OFF current can be increased at low driving voltage.

The semiconductor device which is another embodiment of the present invention is a semiconductor device including an oxide semiconductor film formed by a sputtering method by using the oxide sintered body of the aforementioned embodiment as a target. Since the semiconductor device of the present embodiment includes the oxide semiconductor film formed by the sputtering method by using the oxide sintered body of the aforementioned embodiment as a target, the semiconductor device of the present embodiment has high characteristics.

Details of Embodiments of the Present Invention

First Embodiment: Oxide Sintered Body

An oxide sintered body which is an embodiment of the present invention is an oxide sintered body including indium, tungsten, and at least one of zinc and tin, wherein the oxide sintered body includes, as a crystal phase, a complex oxide crystal phase including tungsten and at least one of zinc and tin. The oxide sintered body of the present embodiment includes, as a crystal phase, the complex oxide crystal phase including tungsten and at least one of zinc and tin, and thus, in a TFT (thin-film transistor) which is a semiconductor device including, as a channel layer, an oxide semiconductor film formed by using the oxide sintered body, the OFF current can be decreased and the ratio of the ON current to the OFF current can be increased at low driving voltage. In addition, the thermal conductivity of the oxide sintered body can be increased.

(Inclusion of In, W, and at Least One of Zn and Sn)

From the perspective of decreasing the OFF current and increasing the ratio of the ON current to the OFF current at low driving voltage, and increasing the thermal conductivity of the oxide sintered body in a TFT (thin-film transistor) which is a semiconductor device including, as a channel layer, an oxide semiconductor film formed by using the oxide sintered body of the present embodiment, it is preferable that the oxide sintered body of the present embodiment includes In (indium), W (tungsten), and at least one of Zn (zinc) and Sn (tin), and includes In as a main component. The main component herein means that a content rate of In to the metal elements and Si (silicon) included in the oxide sintered body of the present embodiment is equal to or higher than 50 atomic %.

(Complex Oxide Crystal Phase)

From the perspective of decreasing the OFF current and increasing the ratio of the ON current to the OFF current at low driving voltage, and increasing the thermal conductivity of the oxide sintered body in a TFT (thin-film transistor) which is a semiconductor device including, as a channel layer, an oxide semiconductor film formed by using the oxide sintered body of the present embodiment, the oxide sintered body of the present embodiment includes, as a crystal phase, the complex oxide crystal phase including W and at least one of Zn and Sn.

From the perspective of decreasing the OFF current and increasing the ratio of the ON current to the OFF current at low driving voltage, and increasing the thermal conductivity of the oxide sintered body in a TFT (thin-film transistor) which is a semiconductor device including, as a channel layer, an oxide semiconductor film formed by using the oxide sintered body including the complex oxide crystal phase, it is preferable that the complex oxide crystal phase includes at least one type of crystal phase selected from the group consisting of a $ZnWO_4$ type phase, a $Zn_2W_3O_8$ type phase, a $WSnO_4$ type phase, a $WSn_2O_5$ type phase, and a $WSn_3O_6$ type phase. The complex oxide crystal phase is identified by X-ray diffraction measurement.

The $ZnWO_4$ type phase is a generic term for a $ZnWO_4$ phase, a phase in which at least one of Si and a metal element other than In, W and Zn is included in a part of the $ZnWO_4$ phase, and a phase having the same crystal structure as that of the $ZnWO_4$ phase, in which oxygen is partially deficient or excessive in these phases. The $Zn_2W_3O_8$ type phase is a generic term for a $Zn_2W_3O_8$ phase, a phase in which at least one of Si and a metal element other than In, W and Zn is included in a part of the $Zn_2W_3O_8$ phase, and a phase having the same crystal structure as that of the $Zn_2W_3O_8$ phase, in which oxygen is partially deficient or excessive in these phases. The $WSnO_4$ type phase is a generic term for a $WSnO_4$ phase, a phase in which at least one of Si and a metal element other than In, W and Sn is included in a part of the $WSnO_4$ phase, and a phase having the same crystal structure as that of the $WSnO_4$ phase, in which oxygen is partially deficient or excessive in these phases. The $WSn_2O_5$ type phase is a generic term for a $WSn_2O_5$ phase, a phase in which at least one of Si and a metal element other than In, W and Sn is included in a part of the $WSn_2O_5$ phase, and a phase having the same crystal structure as that of the $WSn_2O_5$ phase, in which oxygen is partially deficient or excessive in these phases. The $WSn_3O_6$ type phase is a generic term for a $WSn_3O_6$ phase, a phase in which at least one of Si and a metal element other than In, W and Sn is included in a part of the $WSn_3O_6$ phase, and a phase having the same crystal structure as that of the $WSn_3O_6$ phase, in which oxygen is partially deficient or excessive in these phases. One or a plurality of these complex oxide crystal phases may be present.

The $ZnWO_4$ phase is a zinc tungstate compound crystal phase having a crystal structure expressed by a space group of P12/c1(13) and having a crystal structure defined in 01-088-0251 of the JCPDS card. The $Zn_2W_3O_8$ phase is a zinc tungstate compound crystal phase having a crystal structure expressed by a space group of P63mc(186) and disclosed in C. R. Seances Acad. Sci. (Ser. C), 1970, pp 271-136. The $WSnO_4$ crystal phase is a tin tungstate compound crystal phase having a crystal structure expressed by a space group of Pnna(52) and having a crystal structure defined in 01-070-1049 of the JCPDS card. The $WSn_2O_5$ phase is a tin tungstate compound crystal phase having a crystal structure expressed by a space group of P121/c1(14) and disclosed in Inorg. Chem., (2007), 46, pp 7005-7011. The $WSn_3O_6$ phase is a tin tungstate compound crystal phase having a crystal structure expressed by a space group of C12/c1(15) and disclosed in Inorg. Chem., (2007), 46, pp 7005-7011.

The phase in which at least one of Si and a metal element other than the metal elements constituting these complex oxide crystal phases is included in a part of any one of the $ZnWO_4$ phase, the $Zn_2W_3O_8$ phase, the $WSnO_4$ phase, the $WSn_2O_5$ phase, and the $WSn_3O_6$ phase may have such a crystal structure that at least one of Si and a metal element other than the metal elements constituting these complex oxide crystal phases is solid-dissolved in a part of any one of the $ZnWO_4$ phase, the $Zn_2W_3O_8$ phase, the $WSnO_4$ phase, the $WSn_2O_5$ phase, and the $WSn_3O_6$ phase. For example, at least one of Si and a metal element other than the metal elements constituting the aforementioned complex oxide crystal phases may be solid-dissolved in a substitutional-type manner in a part of the W site and/or the Zn site or the Sn site of any one of the $ZnWO_4$ phase, the $Zn_2W_3O_8$ phase, the $WSnO_4$ phase, the $WSn_2O_5$ phase, and the $WSn_3O_6$ phase, or may be solid-dissolved in an interstitial-type manner in between the crystal lattices of any one of the $ZnWO_4$ phase, the $Zn_2W_3O_8$ phase, the $WSnO_4$ phase, the $WSn_2O_5$ phase, and the $WSn_3O_6$ phase.

(Bixbite Type Phase)

From the perspective of decreasing the OFF current and increasing the ratio of the ON current to the OFF current at low driving voltage, and increasing the thermal conductivity of the oxide sintered body in a TFT which is a semiconductor device including, as a channel layer, an oxide semiconductor film formed by using the oxide sintered body of the present embodiment, it is preferable that the oxide sintered body of the present embodiment further includes a bixbite type phase as a crystal phase.

The bixbite type phase is a generic term for a bixbite phase, and a phase having the same crystal structure as that of the bixbite phase, in which at least one of Si and a metal element other than In and W is included in a part of the bixbite phase. The bixbite type phase is identified by X-ray diffraction measurement. The bixbite phase is one of the crystal phases of indium oxide ($In_2O_3$), and refers to a crystal structure defined in 6-0416 of the JCPDS card, and is also called "rare-earth oxide C type phase (or C-rare earth structure phase)". The phase in which at least one of Si and a metal element other than In and W is included in a part of the bixbite phase may have such a crystal structure that at least one of Si and a metal element other than In and W is solid-dissolved in a part of the bixbite phase.

(Complex Oxide Crystal Phase Occupancy Rate)

From the perspective of decreasing the OFF current and increasing the ratio of the ON current to the OFF current at low driving voltage, and increasing the thermal conductivity of the oxide sintered body in a TFT (thin-film transistor) which is a semiconductor device including, as a channel layer, an oxide semiconductor film formed by using the oxide sintered body of the present embodiment, a complex oxide crystal phase occupancy rate, which is an occupancy rate of an area of the complex oxide crystal phase including tungsten and at least one of zinc and tin to an area of a cross section of the oxide sintered body in the cross section, is preferably higher than 0% and equal to or lower than 50%, more preferably equal to or higher than 0.5% and equal to or lower than 30%, and further preferably equal to or higher than 0.5% and equal to or lower than 15%, in the oxide sintered body of the present embodiment.

The complex oxide crystal phase occupancy rate is calculated as follows. First, by using a scanning secondary electron microscope with an energy-dispersive X-ray fluorescence spectrometer (SEM-EDX), the cross section of the mirror-finished oxide sintered body is observed with the SEM, and a composition of each phase is analyzed with the EDX. A crystal structure of each phase is identified by a θ-2θ method in X-ray diffraction measurement. The phases identified by X-ray diffraction measurement have different composition ratios of the metal elements. The difference in composition ratio of the metal elements among the phases of the oxide sintered body has the same tendency as that of the difference in composition ratio among the phases analyzed with the aforementioned EDX. For example, when the $In_2O_3$ phase, the $WSn_2O_5$ phase and the $WSn_3O_6$ phase are identified in X-ray diffraction measurement, the $In_2O_3$ phase has a high In ratio (e.g., In/(In+W+Sn)), and the $WSn_2O_5$ phase and the $WSn_3O_6$ phase have a high W ratio (e.g., W/(In+W+Sn)) and/or a high Sn ratio (e.g., Sn/(In+W+Sn)) in analysis with the EDX. A metal ratio of each sintered powder is obtained by the SEM-EDX, and a region having a high In ratio can be determined as the $In_2O_3$ phase and a region having a high W ratio and/or a high Sn ratio can be determined as the $WSn_2O_5$ phase and the $WSn_3O_6$ phase.

(Double Phase Occupancy Rate of Complex Oxide Crystal Phase and Bixbite Type Phase)

When the oxide sintered body of the present embodiment includes the complex oxide crystal phase and the bixbite type phase as the crystal phases, a double phase occupancy rate, which is an occupancy rate of a total area of the complex oxide crystal phase and the bixbite type phase to an area of a cross section of the oxide sintered body in the cross section, is preferably equal to or higher than 95% and equal to or lower than 100%, and more preferably equal to or higher than 98% and equal to or lower than 100%, from the perspective of decreasing the OFF current and increasing the ratio of the ON current to the OFF current at low driving voltage, reducing variations of the characteristics in the main surface, and increasing the thermal conductivity of the oxide sintered body in a TFT which is a semiconductor device including, as a channel layer, an oxide semiconductor film formed by using the oxide sintered body.

An occupancy rate of an area of the bixbite type phase of the oxide sintered body is calculated in accordance with a method similar to the method for calculating the complex oxide crystal phase occupancy rate which is an occupancy rate of an area of the complex oxide crystal phase to an area of a cross section of the oxide sintered body. Therefore, the double phase occupancy rate which is an occupancy rate of a total area of the complex oxide crystal phase and the bixbite type phase to an area of a cross section is calculated in accordance with a method similar to the method for calculating the complex oxide crystal phase occupancy rate which is an occupancy rate of an area of the complex oxide crystal phase to an area of a cross section of the oxide sintered body.

(Content Rate of Tungsten)

From the perspective of increasing the ratio of the ON current to the OFF current at low driving voltage and increasing the film formation speed of the oxide semiconductor film in a TFT which is a semiconductor device including, as a channel layer, an oxide semiconductor film formed by using the oxide sintered body of the present embodiment, a content rate of tungsten to all metal elements and Si included in the oxide sintered body is preferably equal to or higher than 0.5 atomic % and equal to or lower than 20 atomic %, more preferably equal to or higher than 0.5 atomic % and equal to or lower than 10 atomic %, and further preferably equal to or higher than 7 atomic % and equal to or lower than 10 atomic %, in the oxide sintered body of the present embodiment.

A contained amount of Si or the metal elements such as W in the oxide sintered body is measured by ICP (inductively-coupled plasma) mass spectrometry. The content rate of tungsten is a percentage of a contained amount of W to a total contained amount of all metal elements and Si in the oxide sintered body.

(Content Rate of Metal Elements and Si)

From the perspective of decreasing the OFF current and increasing the ratio of the ON current to the OFF current at low driving voltage in a TFT which is a semiconductor device including, as a channel layer, an oxide semiconductor film formed by using the oxide sintered body of the present embodiment, a content rate of at least one type of element selected from the group consisting of Al (aluminum), Ti (titanium), Cr (chromium), Ga (gallium), Hf (hafnium), Zr (zirconium), Si (silicon), Mo (molybdenum), V (vanadium), Nb (niobium), Ta (tantalum), and Bi (bismuth) to all metal elements and Si (silicon) included in the oxide sintered body is preferably equal to or higher than 0.1 atomic % and equal to or lower than 10 atomic %, more preferably equal to or higher than 0.1 atomic % and equal to or lower than 5 atomic %, and further preferably equal to or higher than 0.1 atomic % and equal to or lower than 1 atomic %.

When a content rate of at least one type of element of Al, Ti, Cr, Ga, Hf, Si, V, and Nb is equal to or higher than 0.1 atomic %, the OFF current of the semiconductor device including the oxide semiconductor obtained by using the oxide sintered body decreases advantageously. However, if the content rate of this element is higher than 10 atomic %, the ON current of the semiconductor device tends to decrease.

In addition, when a content rate of at least one type of element of Zr, Mo, Ta, and Bi is equal to or higher than 0.1 atomic %, the ON current of the semiconductor device including the oxide semiconductor obtained by using the oxide sintered body increases advantageously. However, if the content rate of this element is higher than 10 atomic %, the OFF current of the semiconductor device tends to increase.

Since the oxide semiconductor film formed by using the oxide sintered body according to the present embodiment is used as a semiconductor layer of the semiconductor device, it is desirable that an electric resistivity is higher than that desired as a transparent electroconductive film. Specifically, it is preferable that an electric resistivity of the oxide semiconductor film formed by using the oxide sintered body according to the present embodiment is equal to or higher than $1\times10^{-4}$ Ωcm. For this purpose, it is preferable that a content rate of Si that may be included in the oxide sintered body is lower than 0.007 in a ratio of Si/In atomic number. In addition, it is preferable that a content rate of Ti that may be included in the oxide sintered body is lower than 0.004 in a ratio of Ti/In atomic number.

The electric resistivity of the oxide semiconductor film is measured by the four-terminal method. Mo electrodes are formed as electrode members by the sputtering method. Then, a voltage between the inner electrodes is measured while a voltage of −40 V to +40 V is swept to the outer electrodes and a current is passed. The electric resistance value is thus calculated.

(Method for Manufacturing Oxide Sintered Body)

A method for manufacturing the oxide sintered body of the present embodiment is not particularly limited. However, from the perspective of efficiently manufacturing the oxide sintered body of the present embodiment, the method for manufacturing the oxide sintered body of the present embodiment includes the steps of: preparing a mixture of raw material powders; calcining the mixture; molding a calcined powder; and sintering a molded body.

1. Step of Preparing Raw Material Powders

As the raw material powders for the oxide sintered body, oxide powders of the metal elements and Si that constitute the oxide sintered body, such as an indium oxide powder (e.g., an $In_2O_3$ powder), a tungsten oxide powder (e.g., a $WO_3$ powder), a zinc oxide powder (e.g., a ZnO powder), and a tin oxide powder (e.g., an $SnO_2$ powder), are prepared. As to the tungsten oxide powder, from the perspective of obtaining a high thermal conductivity, it is desirable that the powder such as the $WO_{2.72}$ powder and the $WO_{2.0}$ powder having an oxygen-deficient chemical composition as compared with the $WO_3$ powder is used as a raw material. From the perspective of preventing unintended entry of the metal elements and Si into the oxide sintered body and obtaining the stable properties, it is preferable that a purity of the raw material powders is high, i.e., equal to or higher than 99.9 mass %.

2. Step of Preparing Primary Mixture of Raw Material Powders

Among the aforementioned raw material powders, the raw material powders which are the oxide powders such as the $WO_{2.72}$ powder or the $WO_{2.0}$ powder, the ZnO powder, and the $SnO_2$ powder are first pulverized and mixed. At this time, when it is desired to obtain the $ZnWO_4$ type phase as the crystal phase of the oxide sintered body, the $WO_{2.72}$ powder or the $WO_{2.0}$ powder and the ZnO powder as the raw material powders are mixed at a molar ratio of 1:1. When it is desired to obtain the $Zn_2W_3O_8$ type phase as the crystal phase of the oxide sintered body, the $WO_{2.72}$ powder or the $WO_{2.0}$ powder and the ZnO powder as the raw material powders are mixed at a molar ratio of 3:2. When it is desired to obtain the $WSnO_4$ type phase as the crystal phase of the oxide sintered body, the $WO_{2.72}$ powder or the $WO_{2.0}$ powder and the $SnO_2$ powder as the raw material powders are mixed at a molar ratio of 1:1. When it is desired to obtain the $WSn_2O_5$ type phase as the crystal phase of the oxide sintered body, the $WO_{2.72}$ powder or the $WO_{2.0}$ powder and the $SnO_2$ powder as the raw material powders are mixed at a molar ratio of 1:2. When it is desired to obtain the $WSn_3O_6$ type phase as the crystal phase of the oxide sintered body, the $WO_{2.72}$ powder or the $WO_{2.0}$ powder and the $SnO_2$ powder as the raw material powders are mixed at a molar ratio of 1:3. A method for pulverizing and mixing the raw material powders is not particularly limited, and either a dry-type method or a wet-type method may be used. Specifically, the raw material powders are pulverized and mixed by using a ball mill, a planetary ball mill, a bead mill or the like. In this way, a primary mixture of the raw material powders is obtained. A drying method such as natural drying or a spray dryer may be preferably used to dry the mixture obtained by using the wet-type pulverizing and mixing method.

3. Step of Calcining Primary Mixture

Next, the obtained primary mixture is calcined. A temperature for calcining the primary mixture is not particularly limited. However, it is desirable that the temperature is lower than 1200° C. to prevent a particle size of a calcined product from becoming too large and the sintered density from decreasing. In order to obtain the calcined product including the $ZnWO_4$ type phase, the $Zn_2W_3O_8$ type phase, the $WSnO_4$ type phase, the $WSn_2O_5$ type phase and/or the $WSn_3O_6$ type phase as the crystal phase, it is desirable that the temperature is equal to or higher than 500° C. Therefore, the temperature is preferably equal to or higher than 500° C. and lower than 1000° C., and more preferably equal to or higher than 550° C. and equal to or lower than 900° C. In this way, the calcined product including the $ZnWO_4$ type phase, the $Zn_2W_3O_8$ type phase, the $WSnO_4$ type phase, the $WSn_2O_5$ type phase and/or the $WSn_3O_6$ type phase as the crystal phase is obtained. An air atmosphere or an oxygen-nitrogen mixing atmosphere including oxygen at 25 volume % or more is suitable as a calcination atmosphere.

4. Step of Preparing Secondary Mixture of Raw Material Powders

Next, the obtained calcined product and the $In_2O_3$ powder among the aforementioned raw material powders are pulverized and mixed by the pulverizing and mixing method similar to the one described above. In this way, a secondary mixture of the raw material powders is obtained.

5. Step of Molding Secondary Mixture

Next, the obtained secondary mixture is molded. A method for molding the secondary mixture is not particularly limited. However, from the perspective of increasing the sintered density, a uniaxial press method, a CIP (cold isostatic press) method, a casting method or the like is preferable. In this way, a molded body is obtained.

6. Step of Sintering Molded Body

Next, the obtained molded body is sintered. A temperature for sintering the molded body is not particularly limited. However, from the perspective of setting the sintered density (corresponding to a percentage of an actual sintered density to a theoretical density) to be equal to or higher than 90% and increasing the thermal conductivity, the temperature is preferably equal to or higher than 1000° C. and equal to or lower than 1500° C., and more preferably equal to or higher than 1050° C. and equal to or lower than 1200° C. In addition, a sintering atmosphere is not particularly limited. However, from the perspective of preventing the particle size of the crystals that constitute the oxide sintered body from becoming large and preventing occurrence of cracks, and from the perspective of increasing the thermal conductivity, the atmospheric pressure and the air atmosphere, the oxygen atmosphere, the nitrogen-oxygen mixing atmosphere and the like are preferable, and the atmospheric pressure and the air atmosphere is particularly preferable. In this way, the oxide sintered body of the present embodiment is obtained.

Second Embodiment: Semiconductor Device

Referring to FIG. 1, a semiconductor device 10 which is another embodiment of the present invention includes an oxide semiconductor film 14 formed by the sputtering method by using the oxide sintered body of the first embodiment as the target. Since the semiconductor device of the present embodiment includes the oxide semiconductor film formed by the sputtering method by using the oxide sintered body of the aforementioned embodiment as the target, the semiconductor device of the present embodiment has high characteristics.

Although semiconductor device 10 of the present embodiment is not particularly limited, semiconductor device 10 of the present embodiment is, for example, a TFT (thin-film transistor) which is the semiconductor device including, as a channel layer, oxide semiconductor film 14 formed by the sputtering method by using the oxide sintered body of the first embodiment as the target. Since the TFT which is one example of semiconductor device 10 of the present embodiment includes, as a channel layer, oxide semiconductor film 14 formed by the sputtering method by using the oxide sintered body of the aforementioned embodiment as the target, the OFF current is decreased and the ratio of the ON current to the OFF current is increased at low driving voltage.

More specifically, as shown in FIG. 1, the TFT which is semiconductor device 10 of the present embodiment includes a substrate 11, a gate electrode 12 arranged on substrate 11, a gate insulating film 13 arranged on gate electrode 12 as an insulating layer, oxide semiconductor film 14 arranged on gate insulating film 13 as a channel layer, and a source electrode 15 and a drain electrode 16 arranged on oxide semiconductor film 14 so as not to be in contact with each other.

(Method for Manufacturing Semiconductor Device)

Figure 2:
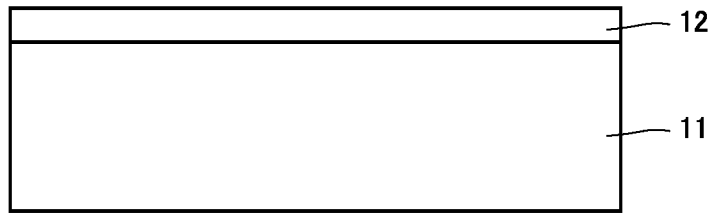
FIG. 2 is a schematic cross-sectional view showing one example of a method for manufacturing the semiconductor device according to the present invention.
Figure 2:
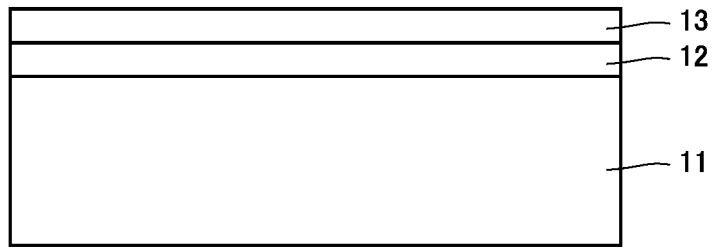
Figure 2:
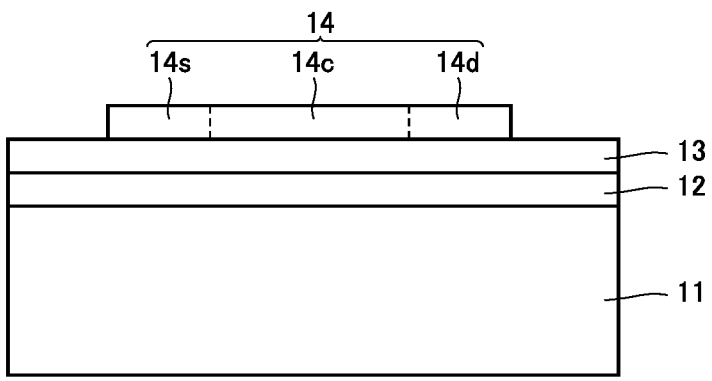
Figure 2:
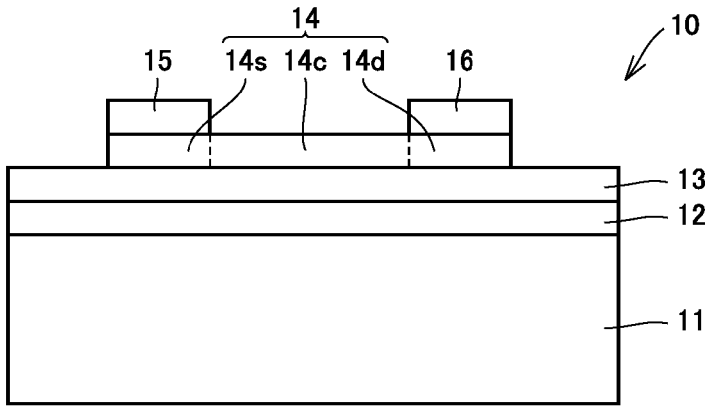

Referring to FIG. 2, a method for manufacturing semiconductor device 10 of the present embodiment is not particularly limited. However, from the perspective of efficiently manufacturing the semiconductor device having high characteristics, it is preferable that the method for manufacturing semiconductor device 10 of the present embodiment includes the steps of forming gate electrode 12 on substrate 11 (FIG. 2(A)), forming gate insulating film 13 on gate electrode 12 as the insulating layer (FIG. 2(B)), forming oxide semiconductor film 14 on gate insulating film 13 as the channel layer (FIG. 2(C)), and forming source electrode 15 and drain electrode 16 on oxide semiconductor film 14 so as not to be in contact with each other (FIG. 2(D)).

1. Step of Forming Gate Electrode

Referring to FIG. 2(A), gate electrode 12 is formed on substrate 11. Although substrate 11 is not particularly limited, a quartz glass substrate, an alkali-free glass substrate, an alkali glass substrate or the like is preferable from the perspective of increasing the transparency, the price stability and the surface smoothness. Although gate electrode 12 is not particularly limited, an Mo electrode, a Ti electrode, a W electrode, an Al electrode, a Cu electrode or the like is preferable from the perspective of high oxidation resistance and low electric resistance. Although a method for forming gate electrode 12 is not particularly limited, the vacuum vapor deposition method, the sputtering method or the like is preferable from the perspective of allowing large-area and uniform formation on a main surface of the substrate.

2. Step of Forming Gate Insulating Film

Referring to FIG. 2(B), gate insulating film 13 is formed on gate electrode 12 as the insulating layer. Although gate insulating film 13 is not particularly limited, an $SiO_x$ film, an $SiN_x$ film or the like is preferable from the perspective of high insulation property. Although a method for forming gate insulating film 13 is not particularly limited, a plasma CVD (chemical vapor deposition) method or the like is preferable from the perspectives of allowing large-area and uniform formation on the main surface of the substrate having the gate electrode formed thereon and of ensuring the insulation property.

3. Step of Forming Oxide Semiconductor Film

Referring to FIG. 2(C), oxide semiconductor film 14 is formed on gate insulating film 13 as the channel layer. From the perspective of manufacturing semiconductor device 10 having high characteristics, oxide semiconductor film 14 is formed by the sputtering method by using the oxide sintered body of the first embodiment as the target. The sputtering method herein refers to a method for forming the film constituted by the atoms forming the target, by arranging the target and the substrate in a film formation chamber to face each other, applying a voltage to the target, and sputtering a surface of the target with a noble gas ion, thereby releasing the atoms forming the target from the target and depositing the atoms on the substrate (also including the substrate having the gate electrode and the gate insulating film formed thereon as described above).

4. Step of Forming Source Electrode and Drain Electrode

Referring to FIG. 2(D), source electrode 15 and drain electrode 16 are formed on oxide semiconductor film 14 so as not to be in contact with each other. Although source electrode 15 and drain electrode 16 are not particularly limited, an Mo electrode, a Ti electrode, a W electrode, an Al electrode, a Cu electrode or the like is preferable from the perspective of high oxidation resistance, low electric resistance and low contact electric resistance with the oxide semiconductor film. Although a method for forming source electrode 15 and drain electrode 16 is not particularly limited, the vacuum vapor deposition method, the sputtering method or the like is preferable from the perspective of allowing large-area and uniform formation on the main surface of the substrate having the oxide semiconductor film formed thereon. Although a method for forming source electrode 15 and drain electrode 16 so as not to be in contact with each other is not particularly limited, formation by an etching method using a photoresist is preferable from the perspective of allowing large-area and uniform formation of the patterns of the source electrode and the drain electrode on the main surface of the substrate having the oxide semiconductor film formed thereon.

EXAMPLE

Examples 1 to 5

1. Preparation of Powder Raw Materials

A $WO_{2.72}$ powder having a particle size of 0.5 μm to 1.2 μm and having a purity of 99.9 mass %, a ZnO powder having an average particle size of 1.0 μm and having a purity of 99.99 mass %, and an $In_2O_3$ powder having an average particle size of 1.0 μm and having a purity of 99.99 mass % were prepared.

2. Preparation of Primary Mixture of Raw Material Powders

First, among the prepared raw material powders, the $WO_{2.72}$ powder and the ZnO powder were put into a ball mill, and were pulverized and mixed for 18 hours to prepare a primary mixture of the raw material powders. A molar mixing ratio between the $WO_{2.72}$ powder and the ZnO powder was set at $WO_{2.72}$:ZnO=1:1. Ethanol was used as a dispersion medium at the time of pulverization and mixing described above. The obtained primary mixture of the raw material powders was dried in the atmosphere.

3. Calcination of Primary Mixture

Next, the obtained primary mixture of the raw material powders was put into a crucible made of alumina, and was calcined for 8 hours at a temperature of 800° C. in an air atmosphere. From the perspective of making a particle size of a calcined powder as small as possible, a lower calcination temperature is preferable as long as the calcination temperature is a temperature that allows formation of a crystal phase. In this way, the calcined product including the $ZnWO_4$ type phase as a crystal phase was obtained.

4. Preparation of Secondary Mixture of Raw Material Powders

Next, the obtained calcined product was put into a pot together with the $In_2O_3$ powder which was the prepared raw material powder, and further was put into a pulverizing and mixing ball mill for 12 hours, and was pulverized and mixed for 12 hours to prepare a secondary mixture of the raw material powders. A mixing ratio between the calcined product and the $In_2O_3$ powder was set such that a molar mixing ratio among the $WO_{2.72}$ powder, the ZnO powder and the $In_2O_3$ powder was as shown in Examples 1 to 5 in Table 1. Ethanol was used as a dispersion medium at the time of pulverization and mixing described above. The obtained mixed powder was dried by spray drying.

5. Molding of Secondary Mixture

Next, the obtained secondary mixture was molded by pressing, and further was pressure-molded at a pressure of 190 MPa in the static water having a room temperature (5° C. to 30° C.) by CIP. A disk-shaped molded body having a diameter of 100 mm and a thickness of about 9 mm was thus obtained.

6. Sintering of Molded Body

Next, the obtained molded body was sintered for 8 hours under the air atmosphere at the sintering temperature shown in Examples 1 to 5 in Table 1. An oxide sintered body was thus obtained.

7. Evaluation of Properties of Oxide Sintered Body

The crystal phases of the obtained oxide sintered body were identified by obtaining a sample from a part of the oxide sintered body and conducting crystal analysis by a powder X-ray diffraction method. Cu-Kα ray was used as X-ray to identify the crystal phases. The crystal phases present in the oxide sintered body were shown in Table 1.

The complex oxide crystal phase and the $In_2O_3$ type phase which is the bixbite type phase in the aforementioned cross section of the obtained oxide sintered body were identified as follows.

A sample was obtained from a part of the oxide sintered body and a surface of the sample was polished to make the surface smooth. Then, by using the SEM-EDX, the surface of the sample was observed by the SEM and a composition ratio of the metal elements of the respective crystal particles was analyzed by the EDX. The crystal particles were grouped in accordance with a tendency of the composition ratio of the metal elements of these crystal particles. Then, the crystal particles could be divided into a group of the crystal particles having a high Zn content rate and a high W content rate, and a group of the crystal particles having a very low Zn content rate and a very low W content rate and having a high In content rate. The group of the crystal particles having a high Zn content rate and a high W content rate was concluded as the $ZnWO_4$ type phase which is the complex oxide crystal phase, and the group of the crystal particles having a very low Zn content rate and a very low W content rate and having a high In content rate was concluded as the $In_2O_3$ type phase which is the bixbite type phase.

The complex oxide crystal phase occupancy rate which is an occupancy rate of an area of the complex oxide crystal phase to an area of the aforementioned cross section of the oxide sintered body in this cross section, and the double phase occupancy rate (hereinafter referred to as the double phase occupancy rate of the complex oxide crystal phase and the $In_2O_3$ type phase which is the bixbite type phase) which is an occupancy rate of a total area of the complex oxide crystal phase and the $In_2O_3$ type phase which is the bixbite type phase to an area of the aforementioned cross section of the oxide sintered body in this cross section were shown in Table 1.

Contained amounts of the metal elements and Si in the obtained oxide sintered body were measured by the ICP mass spectrometry. Based on these contained amounts, a content rate of W to the metal elements and Si included in the oxide sintered body was calculated. The result was shown in Table 1. In Table 1, "Added Element" refers to an element M selected from Al (aluminum), Ti (titanium), Cr (chromium), Ga (gallium), Hf (hafnium), Zr (zirconium), Si (silicon), Mo (molybdenum), V (vanadium), Nb (niobium), Ta (tantalum), and Bi (bismuth), and no added element was used in Examples 1 to 5.

A thermal conductivity of the obtained oxide sintered body was measured by a laser flash method. A sample was obtained from a part of the oxide sintered body and processed into a disk shape of 20 mm in diameter×1 mm in thickness. In order to achieve good heat absorption and radiation rate, carbon spray was applied onto a sample surface, and thereafter, the sample surface was irradiated with a pulsed laser beam. The laser beam had a wavelength of 1.06 μm and a pulse width of 0.4 ms. A relative thermal conductivity of each Example under the assumption that a thermal conductivity of Example 1 was 1 was shown in Table 1.

8. Fabrication of Target

The obtained oxide sintered body was processed into a target having a diameter of 3 inches (76.2 mm) and a thickness of 5.0 mm.

9. Fabrication of Semiconductor Device (1) Formation of Gate Electrode

Referring to FIG. 2(A), a synthetic quartz glass substrate of 50 mm×50 mm×0.6 mm in thickness was first prepared as substrate 11, and an Mo electrode having a thickness of 100 nm was formed on substrate 11 as gate electrode 12 by the sputtering method.

(2) Formation of Gate Insulating Film

Referring to FIG. 2(B), an amorphous $SiO_x$ film having a thickness of 200 nm was next formed on gate electrode 12 as gate insulating film 13 by the plasma CVD method.

(3) Formation of Oxide Semiconductor Film

Referring to FIG. 2(C), oxide semiconductor film 14 having a thickness of 35 nm was next formed on gate insulating film 13 by an RF (alternating current) magnetron sputtering method by using the target processed from the oxide sintered body in each of Examples 1 to 5. Here, a plane of the target having a diameter of 3 inches (76.2 mm) was a sputtering surface.

Specifically, substrate 11 having aforementioned gate electrode 12 and gate insulating film 13 formed thereon was arranged on a water-cooled substrate holder in a film formation chamber of a sputtering apparatus (not shown) such that gate insulating film 13 was exposed. The aforementioned target was arranged at a distance of 90 mm to face gate insulating film 13. The degree of vacuum in the film formation chamber was set at approximately $6×10^{-5}$ Pa and the target was sputtered as follows.

First, with a shutter interposed between gate insulating film 13 and the target, a mixed gas of an Ar (argon) gas and an $O_2$ (oxygen) gas was introduced into the film formation chamber until the pressure of 0.5 Pa was reached. A content rate of the $O_2$ gas in the mixed gas was 1 volume %. The RF electric power of 120 W was applied to the target to cause sputtering discharge, and thereby, cleaning (pre-sputtering) of the target surface was performed for 10 minutes.

Next, the sputtering RF electric power of 120 W was applied to the same target, and with the atmosphere in the film formation chamber maintained, the aforementioned shutter was removed and oxide semiconductor film 14 was formed on gate insulating film 13. A bias voltage was not particularly applied to the substrate holder and the substrate holder was only water-cooled. At this time, the film formation time was set such that oxide semiconductor film 14 had a thickness of 35 nm. In this way, oxide semiconductor film 14 was formed by the RF (alternating current) magnetron sputtering method by using the target processed from the oxide sintered body. This oxide semiconductor film 14 functioned as a channel layer in a TFT (thin-film transistor) which is semiconductor device 10. The film formation speed of oxide semiconductor film 14 in each Example was shown in Table 2. It could be seen from Table 2 that the film formation speed decreased when the W content rate became too high.

Next, a part of oxide semiconductor film 14 thus formed was etched to form a source electrode forming portion 14s, a drain electrode forming portion 14d and a channel portion 14c. A size of a main surface of each of source electrode forming portion 14s and drain electrode forming portion 14d was set to be 100 μm×100 μm, and a channel length CL (referring to FIGS. 1(A) and 1(B) and FIG. 2, channel length CL refers to a distance of channel portion 14c between source electrode 15 and drain electrode 16) was set to be 40 μm, and a channel width Cw (referring to FIGS. 1(A) and 1(B) and FIG. 2, channel width Cw refers to a width of channel portion 14c) was set to be 50 μm. At this time, 25 channel portions shown in FIGS. 1 and 2 in height and 25 channel portions in width were arranged at intervals of 3 mm within the substrate main surface of 75 mm×75 mm such that 25 thin-film transistors (TFTs) which are the semiconductor devices in height and 25 thin-film transistors in width were arranged at intervals of 3 mm within the substrate main surface of 75 mm×75 mm.

The aforementioned etching of a part of oxide semiconductor film 14 was performed, specifically, by preparing an etching aqueous solution including oxalic acid and water at a volume ratio of oxalic acid:water=1:10, and immersing, in this etching aqueous solution, substrate 11 having gate electrode 12, gate insulating film 13 and oxide semiconductor film 14 formed thereon in this order. At this time, a temperature of the etching aqueous solution was raised to 40° C. in a hot bath.

(4) Formation of Source Electrode and Drain Electrode

Referring to FIG. 2(D), source electrode 15 and drain electrode 16 were next formed on oxide semiconductor film 14 to be separated from each other.

Specifically, a resist (not shown) was applied onto oxide semiconductor film 14 and was exposed and developed such that only the main surfaces of source electrode forming portion 14s and drain electrode forming portion 14d of oxide semiconductor film 14 were exposed. An Mo electrode having a thickness of 100 nm as source electrode 15 and an Mo electrode having a thickness of 100 nm as drain electrode 16 were formed on the main surfaces of source electrode forming portion 14s and drain electrode forming portion 14d of oxide semiconductor film 14, respectively, by the sputtering method so as to be separated from each other. Thereafter, the resist on oxide semiconductor film 14 was peeled off. As for these Mo electrodes as the source electrode and the drain electrode, one source electrode and one drain electrode were arranged for one channel portion such that 25 thin-film transistors (TFTs) which are the semiconductor devices in height and 25 thin-film transistors in width were arranged at intervals of 3 mm within the substrate main surface of 75 mm×75 mm. The TFT including oxide semiconductor film 14 as a channel layer was thus manufactured as semiconductor device 10.

Next, the obtained TFT which is semiconductor device 10 was heat-treated at 300° C. for one hour in the nitrogen atmosphere.

10. Evaluation of Characteristics of Semiconductor Device

The characteristics of the TFT which is the semiconductor device were evaluated as follows. First, a measurement needle was brought into contact with the gate electrode, the source electrode and the drain electrode. A source-drain voltage $V_{ds}$ of 7 V was applied to between the source electrode and the drain electrode, and a source-gate voltage $V_{gs}$ applied to between the source electrode and the gate electrode was changed from −10 V to 15 V and a source-drain current $I_{ds}$ at this time was measured. Source-drain current $I_{ds}$ when source-gate voltage $V_{gs}$ was −5 V was defined as the OFF current. A value of the OFF current in each Example was shown in Table 2. Source-drain current $I_{ds}$ when source-gate voltage $V_{gs}$ was 15 V was defined as the ON current and a ratio of a value of the ON current to a value of the OFF current was shown in Table 2.

Next, for all TFTs which are the 25 semiconductor devices in height and the 25 semiconductor devices in width arranged at intervals of 3 mm within the substrate main surface of 75 mm×75 mm, source-gate voltage $V_{gs}$ when source-drain current $I_{ds}$ was 1×10$^{-5}$ A was obtained and variations of source-gate voltage $V_{gs}$ were shown as $\Delta V_{gs}$ in Table 2. Table 2 shows that as variations $\Delta V_{gs}$ become smaller, variations, in the main surface, of the characteristics of the TFT which is the semiconductor device become smaller.

TABLE 1

| | Molar Mixing Ratio of Raw Material Powders | | | | | Sintering | | Complex Oxide Crystal Phase | Double Phase | W Content Rate | Content Rate of Added | Relative Thermal |
|---|---|---|---|---|---|---|---|---|---|---|---|---|
| | W (%) | Z (%) | S (%) | I (%) | M (%) | Added Element | Temperature (° C.) | Crystal Phase | Occupancy Rate (%) | Occupancy Rate (%) | (atomic %) | Element (atomic %) | Conductivity |
| Example 1 | 21.6 | 21.6 | — | 56.8 | — | — | 1000 | I, A | 14.40 | 90 | 16.0 | 0 | 1 |
| Example 2 | 17.6 | 17.6 | — | 64.8 | — | — | 1020 | I, A | 11.52 | 96 | 12.0 | 0 | 1 |
| Example 3 | 12.9 | 12.9 | — | 74.2 | — | — | 1030 | I, A | 7.84 | 98 | 8.0 | 0 | 1.1 |
| Example 4 | 10.2 | 10.2 | — | 79.6 | — | — | 1050 | I, A | 6.00 | 100 | 6.0 | 0 | 1.3 |
| Example 5 | 1.9 | 1.9 | — | 96.2 | — | — | 1100 | I, A | 0.96 | 96 | 1.0 | 0 | 1.2 |
| Example 6 | 7.3 | 4.9 | — | 87.8 | — | — | 1100 | I, B | 3.52 | 88 | 4.0 | 0 | 1 |
| Example 7 | 13.5 | 9.0 | — | 77.5 | — | — | 1120 | I, B | 8.00 | 100 | 8.0 | 0 | 1.2 |
| Example 8 | 17.5 | 11.7 | — | 70.8 | — | — | 1200 | I, B | 10.78 | 98 | 11.0 | 0 | 1 |
| Example 9 | 21.6 | — | 21.6 | 56.8 | — | — | 1050 | I, C | 14.08 | 88 | 16.0 | 0 | 1 |
| Example 10 | 17.6 | — | 17.6 | 64.8 | — | — | 1070 | I, C | 11.76 | 98 | 12.0 | 0 | 1.1 |
| Example 11 | 12.9 | — | 12.9 | 74.2 | — | — | 1090 | I, C | 7.92 | 99 | 8.0 | 0 | 1.2 |
| Example 12 | 10.2 | — | 10.2 | 79.6 | — | — | 1100 | I, C | 6.20 | 100 | 6.0 | 0 | 1.4 |
| Example 13 | 1.9 | — | 1.9 | 96.2 | — | — | 1020 | I, C | 0.92 | 92 | 1.0 | 0 | 1.1 |
| Example 14 | 1.5 | — | 3.1 | 95.4 | — | — | 1150 | I, D | 0.70 | 88 | 0.8 | 0 | 0.9 |
| Example 15 | 9.0 | — | 18.0 | 73.0 | — | — | 1150 | I, D | 5.80 | 100 | 5.8 | 0 | 1.2 |
| Example 16 | 14.4 | — | 28.9 | 56.7 | — | — | 1200 | I, D | 10.85 | 96 | 11.3 | 0 | 1 |
| Example 17 | 2.2 | — | 6.6 | 91.2 | — | — | 1250 | I, E | 1.07 | 89 | 1.2 | 0 | 0.9 |
| Example 18 | 8.6 | — | 25.9 | 65.5 | — | — | 1050 | I, E | 6.20 | 100 | 6.2 | 0 | 1.2 |
| Example 19 | 13.0 | — | 39.0 | 48.0 | — | — | 1050 | I, E | 11.78 | 99 | 11.9 | 0 | 1.1 |

In the raw material section, W represents the WO$_x$ powder (x is 2.0 or 2.72), Z represents the ZnO powder, S represents the SnO$_2$ powder, I represents the In$_2$O$_3$ powder, and M represents the oxide powder of the added element.
In the crystal phase section, I represents the In$_2$O$_3$ type phase, A represents the ZnWO$_4$ type phase, B represents the Zn$_2$W$_3$O$_8$ type phase, C represents the WSnO$_4$ type phase, D represents the WSn$_2$O$_5$ type phase, E represents the WSn$_3$O$_6$ type phase, G represents the InGaZnO$_4$ type phase, W represents the WO$_3$ type phase, Z represents the ZnO type phase, and S represents the SnO$_2$ type phase.

TABLE 2

| | Film Formation Speed (nm/min) | OFF Current (A) | ON Current/OFF Current Ratio (digit) | $\Delta V_{gs}$ (V) |
|---|---|---|---|---|
| Example 1 | 26 | $10^{-12}$ | 8 | 0.19 |
| Example 2 | 27 | $10^{-12}$ | 8 | 0.19 |
| Example 3 | 27 | $10^{-13}$ | 8 | 0.18 |
| Example 4 | 28 | $10^{-13}$ | 8 | 0.12 |
| Example 5 | 28 | $10^{-13}$ | 8 | 0.15 |
| Example 6 | 28 | $10^{-13}$ | 8 | 0.12 |
| Example 7 | 29 | $10^{-13}$ | 8 | 0.15 |
| Example 8 | 30 | $10^{-13}$ | 8 | 0.18 |
| Example 9 | 26 | $10^{-12}$ | 9 | 0.17 |
| Example 10 | 27 | $10^{-12}$ | 9 | 0.16 |
| Example 11 | 30 | $10^{-12}$ | 9 | 0.14 |
| Example 12 | 28 | $10^{-13}$ | 9 | 0.11 |
| Example 13 | 27 | $10^{-12}$ | 9 | 0.12 |
| Example 14 | 25 | $10^{-12}$ | 9 | 0.15 |
| Example 15 | 27 | $10^{-13}$ | 9 | 0.13 |
| Example 16 | 21 | $10^{-12}$ | 9 | 0.16 |
| Example 17 | 21 | $10^{-12}$ | 9 | 0.15 |
| Example 18 | 27 | $10^{-13}$ | 9 | 0.13 |
| Example 19 | 23 | $10^{-12}$ | 9 | 0.16 |

Examples 6 to 8

1. Preparation of Powder Raw Materials

A $WO_{2.0}$ powder, a ZnO powder and an $In_2O_3$ powder were prepared similarly to Examples 1 to 5, except that the $WO_{2.0}$ powder having a particle size of 0.5 μm to 1.2 μm and having a purity of 99.9 mass % was prepared instead of the $WO_{2.72}$ powder having a particle size of 0.5 μm to 1.2 μm and having a purity of 99.9 mass %.

2. Preparation of Primary Mixture of Raw Material Powders

First, among the prepared raw material powders, the $WO_{2.0}$ powder and the ZnO powder were put into a ball mill, and were pulverized and mixed for 18 hours to prepare a primary mixture of the raw material powders. A molar mixing ratio between the $WO_{2.0}$ powder and the ZnO powder was set at $WO_{2.0}$:ZnO=3:2. Ethanol was used as a dispersion medium at the time of pulverization and mixing described above. The obtained primary mixture of the raw material powders was dried in the atmosphere.

3. Calcination of Primary Mixture

Next, the obtained primary mixture of the raw material powders was put into a crucible made of alumina, and was calcined for 5 hours at a temperature of 950° C. in an air atmosphere. From the perspective of making a particle size of a calcined powder as small as possible, a lower calcination temperature is preferable as long as the calcination temperature is a temperature that allows formation of a crystal phase. In this way, the calcined product including the $Zn_2W_3O_8$ type phase as a crystal phase was obtained.

4. Preparation of Secondary Mixture of Raw Material Powders

Next, the obtained calcined product was put into a pot together with the $In_2O_3$ powder which was the prepared raw material powder, and further was put into a pulverizing and mixing ball mill for 12 hours, and was pulverized and mixed for 12 hours to prepare a secondary mixture of the raw material powders. A mixing ratio between the calcined product and the $In_2O_3$ powder was set such that a molar mixing ratio among the $WO_{2.0}$ powder, the ZnO powder and the $In_2O_3$ powder was as shown in Examples 6 to 8 in Table 1. Ethanol was used as a dispersion medium at the time of pulverization and mixing described above. The obtained mixed powder was dried by spray drying.

5. Molding of Secondary Mixture

Next, a disk-shaped molded body having a diameter of 100 mm and a thickness of about 9 mm was obtained similarly to Examples 1 to 5, except that the obtained secondary mixture was used.

6. Sintering of Molded Body

Next, the obtained molded body was sintered for 8 hours under the air atmosphere at the sintering temperature shown in Examples 6 to 8 in Table 1. An oxide sintered body was thus obtained.

7. Evaluation of Properties of Oxide Sintered Body

The crystal phases of the obtained oxide sintered body were identified by conducting crystal analysis by the powder X-ray diffraction method. Cu-Kα ray was used as X-ray to identify the crystal phases, and the presence of the $In_2O_3$ type phase which is the bixbite type phase and the presence of the $Zn_2W_3O_8$ type phase which is the complex oxide crystal phase were identified. Next, calculation of the complex oxide crystal phase occupancy rate, calculation of the double phase occupancy rate of the complex oxide crystal phase and the $In_2O_3$ type phase which is the bixbite type phase, calculation of the W content rate, and calculation of the relative thermal conductivity were performed similarly to Examples 1 to 5, except that a group of the crystal particles having a high Zn content rate and a high W content rate, which was grouped by using the SEM-EDX, was concluded as the $Zn_2W_3O_8$ type phase which is the complex oxide crystal phase. The result was shown in Table 1. No added element was used in Examples 6 to 8.

8. Fabrication of Target

Similarly to Examples 1 to 5, the obtained oxide sintered body was processed into a target having a diameter of 3 inches (76.2 mm) and a thickness of 5.0 mm.

9. Fabrication of Semiconductor Device

Similarly to Examples 1 to 5, a TFT which is a semiconductor device was fabricated. The film formation speed of oxide semiconductor film 14 in each Example was shown in Table 2.

10. Evaluation of Characteristics of Semiconductor Device

Source-drain current $I_{ds}$ when source-gate voltage $V_{gs}$ was −5 V was defined as a value of the OFF current, and source-drain current $I_{ds}$ when source-gate voltage $V_{gs}$ was 15 V was defined as a value of the ON current. Then, similarly to Examples 1 to 5, a ratio of the value of the ON current to the value of the OFF current, and variations $\Delta V_{gs}$ of source-gate voltage $V_{gs}$ were measured as the characteristics of the TFT which is the semiconductor device. The result was shown in Table 2.

Examples 9 to 13

1. Preparation of Powder Raw Materials

A $WO_{2.72}$ powder, an $SnO_2$ powder and an $In_2O_3$ powder were prepared similarly to Examples 1 to 5, except that the $SnO_2$ powder having an average particle size of 1.0 μm and having a purity of 99.99 mass % was prepared instead of the ZnO powder having an average particle size of 1.0 μm and having a purity of 99.99 mass %.

2. Preparation of Primary Mixture of Raw Material Powders

First, among the prepared raw material powders, the $WO_{2.72}$ powder and the $SnO_2$ powder were put into a ball mill, and were pulverized and mixed for 18 hours to prepare a primary mixture of the raw material powders. A molar mixing ratio between the $WO_{2.72}$ powder and the $SnO_2$ powder was set at $WO_{2.72}$:$SnO_2$=1:1. Ethanol was used as a dispersion medium at the time of pulverization and mixing described above. The obtained primary mixture of the raw material powders was dried in the atmosphere.

3. Calcination of Primary Mixture

Next, the obtained primary mixture of the raw material powders was put into a crucible made of alumina, and was calcined for 5 hours at a temperature of 650° C. in an air atmosphere. From the perspective of making a particle size of a calcined powder as small as possible, a lower calcination temperature is preferable as long as the calcination temperature is a temperature that allows formation of a crystal phase. In this way, the calcined product including the $WSnO_4$ type phase as a crystal phase was obtained.

4. Preparation of Secondary Mixture of Raw Material Powders

Next, the obtained calcined product was put into a pot together with the $In_2O_3$ powder which was the prepared raw material powder, and further was put into a pulverizing and mixing ball mill for 12 hours, and was pulverized and mixed for 12 hours to prepare a secondary mixture of the raw material powders. A mixing ratio between the calcined product and the $In_2O_3$ powder was set such that a molar mixing ratio among the $WO_{2.72}$ powder, the $SnO_2$ powder and the $In_2O_3$ powder was as shown in Examples 9 to 13 in Table 1. Ethanol was used as a dispersion medium at the time of pulverization and mixing described above. The obtained mixed powder was dried by spray drying.

5. Molding of Secondary Mixture

Next, a disk-shaped molded body having a diameter of 100 mm and a thickness of about 9 mm was obtained similarly to Examples 1 to 5, except that the obtained secondary mixture was used.

6. Sintering of Molded Body

Next, the obtained molded body was sintered for 8 hours under the air atmosphere at the sintering temperature shown in Examples 9 to 13 in Table 1. An oxide sintered body was thus obtained.

7. Evaluation of Properties of Oxide Sintered Body

The crystal phases of the obtained oxide sintered body were identified by conducting crystal analysis by the powder X-ray diffraction method. Cu-Kα ray was used as X-ray to identify the crystal phases, and the presence of the $In_2O_3$ type phase which is the bixbite type phase and the presence of the $WSnO_4$ type phase which is the complex oxide crystal phase were identified. Next, calculation of the complex oxide crystal phase occupancy rate, calculation of the double phase occupancy rate of the complex oxide crystal phase and the $In_2O_3$ type phase which is the bixbite type phase, calculation of the W content rate, and calculation of the relative thermal conductivity were performed similarly to Examples 1 to 5, except that by using the SEM-EDX, the crystal particles were divided into a group of the crystal particles having a high Sn content rate and a high W content rate, and a group of the crystal particles having a very low Sn content rate and a very low W content rate and having a high In content rate, and the group of the crystal particles having a high Sn content rate and a high W content rate was concluded as the $WSnO_4$ type phase which is the complex oxide crystal phase, and the group of the crystal particles having a very low Sn content rate and a very low W content rate and having a high In content rate was concluded as the $In_2O_3$ type phase which is the bixbite type phase. The result was shown in Table 1. No added element was used in Examples 9 to 13.

8. Fabrication of Target

Similarly to Examples 1 to 5, the obtained oxide sintered body was processed into a target having a diameter of 3 inches (76.2 mm) and a thickness of 5.0 mm.

9. Fabrication of Semiconductor Device

Similarly to Examples 1 to 5, a TFT which is a semiconductor device was fabricated. The film formation speed of oxide semiconductor film 14 in each Example was shown in Table 2.

10. Evaluation of Characteristics of Semiconductor Device

Source-drain current $I_{ds}$ when source-gate voltage $V_{gs}$ was ~5 V was defined as a value of the OFF current, and source-drain current $I_{ds}$ when source-gate voltage $V_{gs}$ was 15 V was defined as a value of the ON current. Then, similarly to Examples 1 to 5, a ratio of the value of the ON current to the value of the OFF current, and variations $\Delta V_{gs}$ of source-gate voltage $V_{gs}$ were measured as the characteristics of the TFT which is the semiconductor device. The result was shown in Table 2.

Examples 14 to 16

1. Preparation of Powder Raw Materials

A $WO_{2.72}$ powder, an $SnO_2$ powder and an $In_2O_3$ powder were prepared similarly to Examples 9 to 13.

2. Preparation of Primary Mixture of Raw Material Powders

First, among the prepared raw material powders, the $WO_{2.72}$ powder and the $SnO_2$ powder were put into a ball mill, and were pulverized and mixed for 18 hours to prepare a primary mixture of the raw material powders. A molar mixing ratio between the $WO_{2.72}$ powder and the $SnO_2$ powder was set at $WO_{2.72}$: $SnO_2$=1:2. Ethanol was used as a dispersion medium at the time of pulverization and mixing described above. The obtained primary mixture of the raw material powders was dried in the atmosphere.

3. Calcination of Primary Mixture

Next, the obtained primary mixture of the raw material powders was put into a crucible made of alumina, and was calcined for 5 hours at a temperature of 800° C. in an air atmosphere. From the perspective of making a particle size of a calcined powder as small as possible, a lower calcination temperature is preferable as long as the calcination temperature is a temperature that allows formation of a crystal phase. In this way, the calcined product including the $WSn_2O_5$ type phase as a crystal phase was obtained.

4. Preparation of Secondary Mixture of Raw Material Powders

Next, the obtained calcined product was put into a pot together with the $In_2O_3$ powder which was the prepared raw material powder, and further was put into a pulverizing and mixing ball mill for 12 hours, and was pulverized and mixed for 12 hours to prepare a secondary mixture of the raw material powders. A mixing ratio between the calcined product and the $In_2O_3$ powder was set such that a molar mixing ratio among the $WO_{2.72}$ powder, the $SnO_2$ powder and the $In_2O_3$ powder was as shown in Examples 14 to 16 in Table 1. Ethanol was used as a dispersion medium at the time of pulverization and mixing described above. The obtained mixed powder was dried by spray drying.

5. Molding of Secondary Mixture

Next, a disk-shaped molded body having a diameter of 100 mm and a thickness of about 9 mm was obtained similarly to Examples 1 to 5, except that the obtained secondary mixture was used.

6. Sintering of Molded Body

Next, the obtained molded body was sintered for 8 hours under the air atmosphere at the sintering temperature shown in Examples 14 to 16 in Table 1. An oxide sintered body was thus obtained.

7. Evaluation of Properties of Oxide Sintered Body

The crystal phases of the obtained oxide sintered body were identified by conducting crystal analysis by the powder X-ray diffraction method. Cu-Kα ray was used as X-ray to identify the crystal phases, and the presence of the $In_2O_3$ type phase which is the bixbite type phase and the presence of the $WSn_2O_5$ type phase which is the complex oxide crystal phase were identified. Next, calculation of the complex oxide crystal phase occupancy rate, calculation of the double phase occupancy rate of the complex oxide crystal phase and the $In_2O_3$ type phase which is the bixbite type phase, calculation of the W content rate, and calculation of the relative thermal conductivity were performed similarly to Examples 9 to 13, except that a group of the crystal particles having a high Sn content rate and a high W content rate, which was grouped by using the SEM-EDX, was concluded as the $WSn_2O_5$ type phase which is the complex oxide crystal phase. The result was shown in Table 1. No added element was used in Examples 14 to 16.

8. Fabrication of Target

Similarly to Examples 1 to 5, the obtained oxide sintered body was processed into a target having a diameter of 3 inches (76.2 mm) and a thickness of 5.0 mm.

9. Fabrication of Semiconductor Device

Similarly to Examples 1 to 5, a TFT which is a semiconductor device was fabricated. The film formation speed of oxide semiconductor film 14 in each Example was shown in Table 2.

10. Evaluation of Characteristics of Semiconductor Device

Source-drain current $I_{ds}$ when source-gate voltage $V_{gs}$ was −5 V was defined as a value of the OFF current, and source-drain current $I_{ds}$ when source-gate voltage $V_{gs}$ was 15 V was defined as a value of the ON current. Then, similarly to Examples 1 to 5, a ratio of the value of the ON current to the value of the OFF current, and variations $\Delta V_{gs}$ of source-gate voltage $V_{gs}$ were measured as the characteristics of the TFT which is the semiconductor device. The result was shown in Table 2.

Examples 17 to 19

1. Preparation of Powder Raw Materials

A $WO_{2.0}$ powder, an $SnO_2$ powder and an $In_2O_3$ powder were prepared similarly to Examples 9 to 13, except that the $WO_{2.0}$ powder having a particle size of 0.5 μm to 1.2 μm and having a purity of 99.9 mass % was prepared instead of the $WO_{2.72}$ powder having a particle size of 0.5 μm to 1.2 μm and having a purity of 99.9 mass %.

2. Preparation of Primary Mixture of Raw Material Powders

First, among the prepared raw material powders, the $WO_{2.0}$ powder and the $SnO_2$ powder were put into a ball mill, and were pulverized and mixed for 18 hours to prepare a primary mixture of the raw material powders. A molar mixing ratio between the $WO_{2.0}$ powder and the $SnO_2$ powder was set at $WO_{2.0}$:$SnO_2$=1:3. Ethanol was used as a dispersion medium at the time of pulverization and mixing described above. The obtained primary mixture of the raw material powders was dried in the atmosphere.

3. Calcination of Primary Mixture

Next, the obtained primary mixture of the raw material powders was put into a crucible made of alumina, and was calcined for 5 hours at a temperature of 950° C. in an air atmosphere. From the perspective of making a particle size of a calcined powder as small as possible, a lower calcination temperature is preferable as long as the calcination temperature is a temperature that allows formation of a crystal phase. In this way, the calcined product including the $WSn_3O_6$ type phase as a crystal phase was obtained.

4. Preparation of Secondary Mixture of Raw Material Powders

Next, the obtained calcined product was put into a pot together with the $In_2O_3$ powder which was the prepared raw material powder, and further was put into a pulverizing and mixing ball mill for 12 hours, and was pulverized and mixed for 12 hours to prepare a secondary mixture of the raw material powders. A mixing ratio between the calcined product and the $In_2O_3$ powder was set such that a molar mixing ratio among the $WO_{2.0}$ powder, the $SnO_2$ powder and the $In_2O_3$ powder was as shown in Examples 17 to 19 in Table 1. Ethanol was used as a dispersion medium at the time of pulverization and mixing described above. The obtained mixed powder was dried by spray drying.

5. Molding of Secondary Mixture

Next, a disk-shaped molded body having a diameter of 100 mm and a thickness of about 9 mm was obtained similarly to Examples 1 to 5, except that the obtained secondary mixture was used.

6. Sintering of Molded Body

Next, the obtained molded body was sintered for 8 hours under the air atmosphere at the sintering temperature shown in Examples 17 to 19 in Table 1. An oxide sintered body was thus obtained.

7. Evaluation of Properties of Oxide Sintered Body

The crystal phases of the obtained oxide sintered body were identified by conducting crystal analysis by the powder X-ray diffraction method. Cu-Kα ray was used as X-ray to identify the crystal phases, and the presence of the $In_2O_3$ type phase which is the bixbite type phase and the presence of the $WSn_3O_6$ type phase which is the complex oxide crystal phase were identified. Next, calculation of the complex oxide crystal phase occupancy rate, calculation of the double phase occupancy rate of the complex oxide crystal phase and the $In_2O_3$ type phase which is the bixbite type phase, calculation of the W content rate, and calculation of the relative thermal conductivity were performed similarly to Examples 9 to 13, except that a group of the crystal particles having a high Sn content rate and a high W content rate, which was grouped by using the SEM-EDX, was concluded as the $WSn_3O_6$ type phase which is the complex oxide crystal phase. The result was shown in Table 1. No added element was used in Examples 17 to 19.

8. Fabrication of Target

Similarly to Examples 1 to 5, the obtained oxide sintered body was processed into a target having a diameter of 3 inches (76.2 mm) and a thickness of 5.0 mm.

9. Fabrication of Semiconductor Device

Similarly to Examples 1 to 5, a TFT which is a semiconductor device was fabricated. The film formation speed of oxide semiconductor film 14 in each Example was shown in Table 2.

10. Evaluation of Characteristics of Semiconductor Device

Source-drain current $I_{ds}$ when source-gate voltage $V_{gs}$ was −5 V was defined as a value of the OFF current, and source-drain current $I_{ds}$ when source-gate voltage $V_{gs}$ was 15 V was defined as a value of the ON current. Then, similarly to Examples 1 to 5, a ratio of the value of the ON current to the value of the OFF current, and variations $\Delta V_{gs}$ of source-gate voltage $V_{gs}$ were measured as the characteristics of the TFT which is the semiconductor device. The result was shown in Table 2.

Examples 20 to 36

An oxide sintered body was fabricated similarly to Examples 1 to 19, except that an oxide powder ($Al_2O_3$, $TiO_2$, $Cr_2O_3$, $Ga_2O_3$, $HfO_2$, $SnO_2$, $V_2O_5$, $Nb_2O_3$, $ZrO_2$, $MoO_2$, $Ta_2O_3$, $Bi_2O_3$) including the added element as shown in Examples 20 to 36 in Table 3 was added as a raw material powder, in addition to the calcined product and the $In_2O_3$ powder, when the secondary mixture of the raw material powders was prepared. A molar mixing ratio of the oxide powder including the added element was shown in Table 3. The obtained oxide sintered body was processed into a target, and a TFT which is a semiconductor device including an oxide semiconductor film formed by the RF magnetron sputtering method by using this target was fabricated.

The properties of the obtained oxide sintered body were shown in Table 3, and the characteristics of the obtained TFT which is the semiconductor device were shown in Table 4. The methods for measuring the properties and the characteristics were similar to those in Examples 1 to 19.

TABLE 3

| | Molar Mixing Ratio of Raw Material Powders | | | | | | Sintering | | Complex Oxide Crystal Phase | Double Phase | W Content Rate | Content Rate of Added | Relative Thermal |
|---|---|---|---|---|---|---|---|---|---|---|---|---|---|
| | W (%) | Z (%) | S (%) | I (%) | M (%) | Added Element | Temperature (°C.) | Crystal Phase | Occupancy Rate (%) | Occupancy Rate (%) | (atomic %) | Element (atomic %) | Conductivity |
| Example 20 | 10.1 | — | 10.1 | 79.3 | 0.5 | Al | 1100 | I, C | 6.00 | 100 | 6.0 | 1 | 1 |
| Example 21 | 9.9 | — | 9.9 | 77.3 | 2.9 | Ti | 1100 | I, C | 6.00 | 100 | 6.0 | 3 | 1 |
| Example 22 | 10.1 | — | 10.1 | 78.8 | 1.0 | Cr | 1100 | I, C | 6.00 | 100 | 6.0 | 2 | 1 |
| Example 23 | 9.7 | — | 9.7 | 76.3 | 4.3 | Ga | 1100 | I, C | 6.00 | 100 | 6.0 | 9 | 1 |
| Example 24 | 9.1 | 3.4 | 9.1 | 71.7 | 6.7 | Ga | 1100 | I, G, C | 5.64 | 94 | 6.0 | 15 | 0.9 |
| Example 25 | 15.2 | 1.2 | 30.4 | 50.8 | 2.4 | Ga | 1050 | I, G, D | 11.31 | 87 | 13.0 | 5 | 0.9 |
| Example 26 | 9.5 | 2.3 | 28.6 | 54.9 | 4.7 | Ga | 1350 | I, G, E | 7.36 | 92 | 8.0 | 10 | 0.9 |
| Example 27 | 9.5 | 9.5 | — | 72.3 | 8.7 | Ga | 1100 | I, G, A | 5.83 | 94 | 6.2 | 19 | 0.9 |
| Example 28 | 2.0 | 1.3 | — | 88.9 | 7.8 | Ga | 1200 | I, G, B | 1.08 | 98 | 1.1 | 17 | 0.9 |
| Example 29 | 10.0 | 10.0 | — | 75.2 | 4.8 | Hf | 1120 | I, A | 6.20 | 100 | 6.2 | 5 | 1 |
| Example 30 | 10.4 | 10.4 | — | 78.2 | 1.0 | Si | 1060 | I, A | 6.20 | 100 | 6.2 | 1 | 1 |
| Example 31 | 10.2 | 10.2 | — | 76.7 | 2.9 | V | 1070 | I, A | 6.20 | 100 | 6.2 | 6 | 1 |
| Example 32 | 10.2 | 10.2 | — | 76.7 | 2.9 | Nb | 1050 | I, A | 6.20 | 100 | 6.2 | 6 | 1 |
| Example 33 | 10.4 | 10.4 | — | 78.2 | 1.0 | Zr | 1020 | I, A | 6.20 | 100 | 6.2 | 1 | 1 |
| Example 34 | 10.0 | 10.0 | — | 75.2 | 4.8 | Mo | 1030 | I, A | 6.20 | 100 | 6.2 | 5 | 1 |
| Example 35 | 10.3 | 10.3 | — | 77.9 | 1.5 | Ta | 1150 | I, A | 6.20 | 100 | 6.2 | 3 | 1 |
| Example 36 | 10.4 | 10.4 | — | 78.2 | 1.0 | Bi | 1250 | I, A | 6.20 | 100 | 6.2 | 2 | 1 |
| Comparative Example 1 | 10.5 | 10.5 | — | 79.0 | — | — | 1100 | I, Z, W | 0.00 | 94 | 6.2 | 0 | 0.7 |
| Comparative Example 2 | 10.2 | — | 10.2 | 79.6 | — | — | 1100 | I, S, W | 0.00 | 94 | 6.2 | 0 | 0.7 |

In the raw material section, W represents the $WO_x$ powder (x is 2.0 or 2.72), Z represents the ZnO powder, S represents the $SnO_2$ powder, I represents the $In_2O_3$ powder, and M represents the oxide powder of the added element.

In the crystal phase section, I represents the $In_2O_3$ type phase, A represents the $ZnWO_4$ type phase, B represents the $Zn_2W_3O_8$ type phase, C represents the $WSnO_4$ type phase, D represents the $WSn_2O_5$ type phase, E represents the $WSn_3O_6$ type phase, G represents the $InGaZnO_4$ type phase, W represents the $WO_3$ type phase, Z represents the ZnO type phase, and S represents the $SnO_2$ type phase.

TABLE 4

| | Film Formation Speed (nm/min) | OFF Current (A) | ON Current/OFF Current Ratio (digit) | $\Delta V_{gs}$ (V) |
|---|---|---|---|---|
| Example 20 | 28 | $10^{-13}$ | 8 | 0.22 |
| Example 21 | 28 | $10^{-13}$ | 8 | 0.21 |
| Example 22 | 28 | $10^{-13}$ | 8 | 0.20 |
| Example 23 | 28 | $10^{-13}$ | 8 | 0.20 |
| Example 24 | 26 | $10^{-13}$ | 8 | 0.19 |
| Example 25 | 28 | $10^{-13}$ | 8 | 0.20 |
| Example 26 | 27 | $10^{-13}$ | 8 | 0.20 |
| Example 27 | 25 | $10^{-13}$ | 8 | 0.19 |
| Example 28 | 26 | $10^{-13}$ | 8 | 0.20 |
| Example 29 | 28 | $10^{-13}$ | 8 | 0.21 |
| Example 30 | 28 | $10^{-13}$ | 8 | 0.21 |
| Example 31 | 28 | $10^{-13}$ | 8 | 0.20 |
| Example 32 | 28 | $10^{-12}$ | 9 | 0.22 |
| Example 33 | 27 | $10^{-12}$ | 9 | 0.22 |
| Example 34 | 27 | $10^{-12}$ | 9 | 0.21 |
| Example 35 | 27 | $10^{-12}$ | 9 | 0.20 |
| Example 36 | 27 | $10^{-12}$ | 9 | 0.20 |
| Comparative Example 1 | 20 | $10^{-11}$ | 5 | 0.35 |
| Comparative Example 2 | 23 | $10^{-11}$ | 5 | 0.30 |

Comparative Examples 1 to 2

An oxide sintered body was fabricated similarly to Examples 1 to 8 or Examples 9 to 19, except that when the oxide sintered body was fabricated, the mixture of the raw material powders was prepared and thereafter the mixture of the raw material powders was molded and sintered without being calcined. The obtained oxide sintered body was processed into a target, and a TFT which is a semiconductor device including an oxide semiconductor film formed by the RF magnetron sputtering method by using this target was fabricated. Since the mixture of the raw material powders was molded and sintered without being calcined, it was confirmed that a complex oxide crystal phase was not generated. Comparative Examples 1 and 2 are different from each other in terms of a molar mixing ratio among the $WO_{2.72}$ powder or the $WO_{2.0}$ powder, the ZnO powder or the $SnO_2$ powder, and the $In_2O_3$ powder. The properties of the oxide sintered body were shown in Table 3, and the characteristics of the TFT which is the semiconductor device were shown in Table 4. The methods for measuring the properties and the characteristics were similar to those in Examples.

Referring to Tables 1 to 4, in the TFT (thin-film transistor) which is the semiconductor device including, as a channel layer, the oxide semiconductor film formed by using the oxide sintered body including indium, tungsten, and at least one of zinc and tin, and including, as a crystal phase, the complex oxide crystal phase including tungsten and at least one of zinc and tin, the OFF current could be decreased to be lower than $1\times10^{-11}$ A, and the ratio of the ON current to the OFF current could be increased to the eight digits (the eight digits represent equal to or higher than $1\times10^8$ and lower than $1\times10^9$, and the same will be applied hereinafter) at low driving voltage. In addition, the thermal conductivity of the oxide sintered body could be increased. In the section of the ratio of the ON current to the OFF current in Tables 2 and 4, the nine digits represent equal to or higher than $1\times10^9$ and lower than $1\times10^{10}$, and the five digits represent equal to or higher than $1\times10^5$ and lower than $1\times10^6$.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

10 semiconductor device, 11 substrate, 12 gate electrode, 13 gate insulating film, 14 oxide semiconductor film, 14c channel portion, 14d drain electrode forming portion, 14s source electrode forming portion, 15 source electrode, 16 drain electrode.

The invention claimed is:

1. An oxide sintered body comprising indium, tungsten, and at least one of zinc and tin, wherein
said oxide sintered body includes, as a crystal phase, a complex oxide crystal phase including tungsten and at least one of zinc and tin,
further including a bixbite type phase as a crystal phase.
2. The oxide sintered body according to claim 1, wherein a double phase occupancy rate, which is an occupancy rate of a total area of said complex oxide crystal phase and said bixbite type phase to an area of a cross section of said oxide sintered body in said cross section, is equal to or higher than 95% and equal to or lower than 100%.
3. The oxide sintered body according to claim 1, wherein a complex oxide crystal phase occupancy rate, which is an occupancy rate of an area of said complex oxide crystal phase to an area of a cross section of said oxide sintered body in said cross section, is higher than 0% and equal to or lower than 50%.
4. The oxide sintered body according to claim 1, wherein said complex oxide crystal phase includes at least one type of crystal phase selected from the group consisting of a $ZnWO_4$ type phase, a $Zn_2W_3O_8$ type phase, a $WSnO_4$ type phase, a $WSn_2O_5$ type phase, and a $WSn_3O_6$ type phase.
5. The oxide sintered body according to claim 1, wherein a content rate of tungsten to all metal elements and silicon included in said oxide sintered body is equal to or higher than 0.5 atomic % and equal to or lower than 20 atomic %.
6. The oxide sintered body according to claim 1, wherein a content rate of at least one type of element selected from the group consisting of aluminum, titanium, chromium, gallium, hafnium, zirconium, silicon, molybdenum, vanadium, niobium, tantalum, and bismuth to all metal elements and silicon included in said oxide sintered body is equal to or higher than 0.1 atomic % and equal to or lower than 10 atomic %.
7. A semiconductor device comprising an oxide semiconductor film formed by a sputtering method by using the oxide sintered body as recited in claim 1 as a target.

* * * * *